(12) United States Patent
Xiong et al.

(10) Patent No.: US 11,114,579 B2
(45) Date of Patent: Sep. 7, 2021

(54) METHOD FOR PREPARING ULTRATHIN TWO-DIMENSIONAL NANOSHEETS AND APPLICATIONS THEREOF

(71) Applicant: University of Electronic Science and Technology of China, Chengdu (CN)

(72) Inventors: Jie Xiong, Chengdu (CN); Chuanhui Gong, Chengdu (CN); Yang Wang, Chengdu (CN); Gaofeng Rao, Chengdu (CN); Chujun Yin, Chengdu (CN); Chaoyi Yan, Chengdu (CN); Junwei Chu, Chengdu (CN); Jianwen Huang, Chengdu (CN); Miao Zhang, Chengdu (CN); Xinrui Chen, Chengdu (CN); Yuqing Liu, Chengdu (CN); Chunyang Wu, Chengdu (CN); Xianfu Wang, Chengdu (CN); Liping Dai, Chengdu (CN); Wanli Zhang, Chengdu (CN); Yanrong Li, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/905,995

(22) Filed: Jun. 19, 2020

(65) Prior Publication Data
US 2020/0403111 A1    Dec. 24, 2020

(30) Foreign Application Priority Data

Jun. 19, 2019  (CN) .......................... 201910531231.8
Jan. 20, 2020  (CN) .......................... 202010066141.9
Jan. 20, 2020  (CN) .......................... 202010066148.0

(51) Int. Cl.
*H01L 31/18*     (2006.01)
*C23C 14/18*     (2006.01)
(Continued)

(52) U.S. Cl.
CPC ............ *H01L 31/18* (2013.01); *C23C 14/042* (2013.01); *C23C 14/18* (2013.01); *C23C 14/24* (2013.01);
(Continued)

(58) Field of Classification Search
CPC ..... C23C 14/0694; C23C 14/24; C23C 14/16; C23C 14/18; C23C 8/12; H01L 35/22;
(Continued)

(56) References Cited

U.S. PATENT DOCUMENTS

2016/0293858 A1*  10/2016  Brandt ................. H01L 31/032
2017/0268128 A1*   9/2017  Qi ........................... C23C 16/52

* cited by examiner

*Primary Examiner* — Jaehwan Oh
(74) *Attorney, Agent, or Firm* — Matthias Scholl P.C.; Matthias Scholl

(57) ABSTRACT

A method for preparing an ultrathin two-dimensional (2D) monocrystalline nanosheet, the method including: 1) placing $BiX_3$ powder where X=I, Br, or Cl in a crucible, and putting the crucible on a first heating zone of a furnace disposed at a gas inlet of a quartz tube; placing substrates covered with metal sheets on a second heating zone of the furnace disposed at a gas outlet of the quartz tube; 2) vacuumizing the quartz tube; pumping Ar gas into the quartz tube until the air pressure is 101.325 kPa; pumping a carrier gas into the quartz tube; and 3) heating and maintaining the second heating zone; heating the first heating zone for $BiX_3$ evaporation until producing chemical reaction between $BiX_3$ and the metal sheets, and preparing ultrathin 2D nanosheets on the substrates simultaneously; and cooling the substrate naturally to 15-30° C.

20 Claims, 18 Drawing Sheets

(51) Int. Cl.
    *C23C 14/24* (2006.01)
    *C23C 14/04* (2006.01)
    *H01L 31/09* (2006.01)
    *C30B 29/12* (2006.01)
    *C30B 29/64* (2006.01)
    *H01L 31/0224* (2006.01)
    *H01L 31/032* (2006.01)
    *C30B 25/10* (2006.01)

(52) U.S. Cl.
    CPC .............. *C30B 25/10* (2013.01); *C30B 29/12* (2013.01); *C30B 29/64* (2013.01); *H01L 31/0224* (2013.01); *H01L 31/032* (2013.01); *H01L 31/09* (2013.01)

(58) Field of Classification Search
    CPC . H01L 31/022425; H01L 31/09; H01L 31/18; C30B 25/10; C30B 25/183; C30B 29/12; C30B 29/64
    See application file for complete search history.

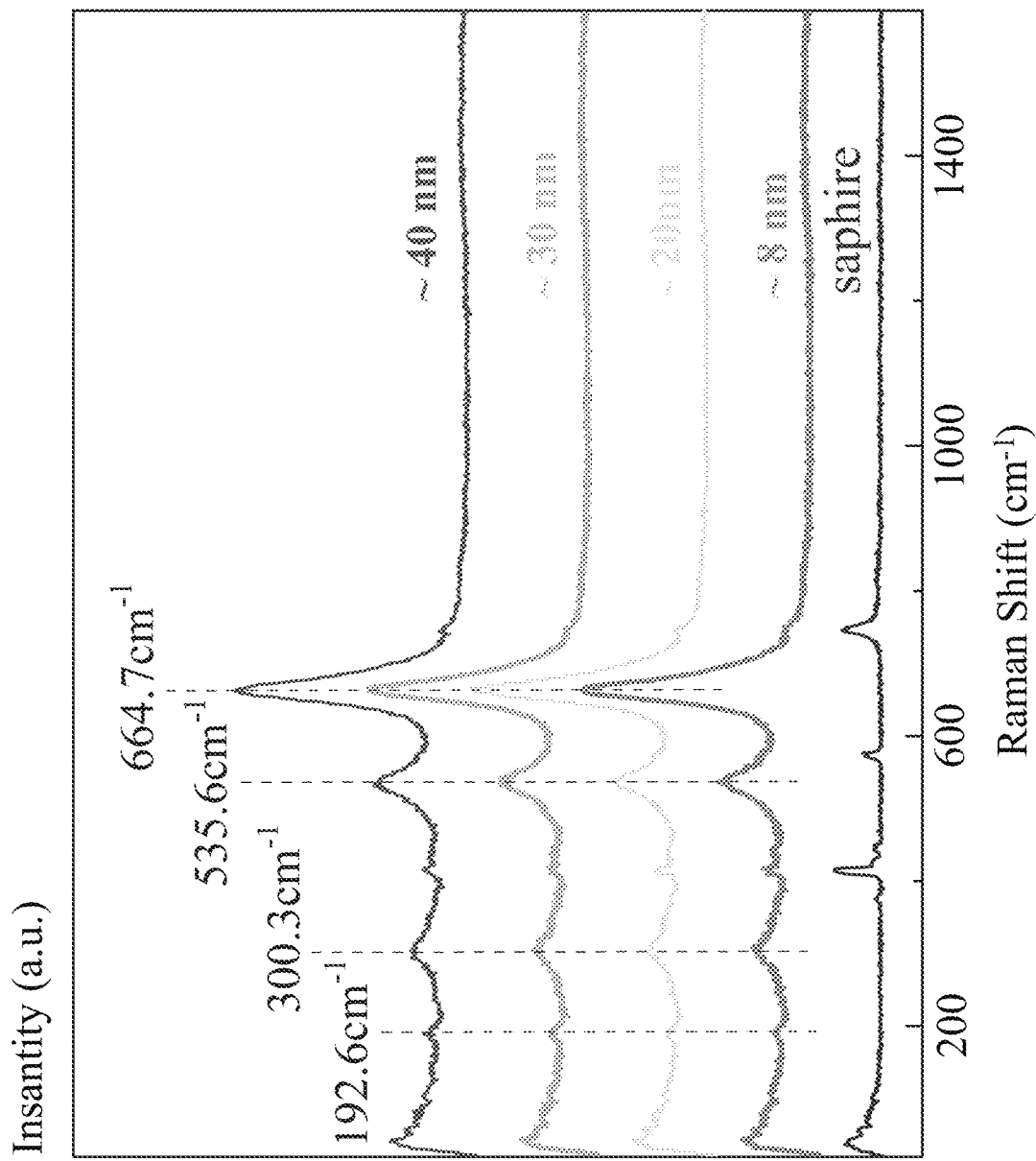

METHOD FOR PREPARING ULTRATHIN TWO-DIMENSIONAL NANOSHEETS AND APPLICATIONS THEREOF

CROSS-REFERENCE TO RELATED APPLICATIONS

Pursuant to 35 U.S.C. § 119 and the Paris Convention Treaty, this application claims foreign priority to Chinese Patent Application No. 201910531231.8 filed Jun. 19, 2019, to Chinese Patent Application No. 202010066141.9 filed Jan. 20, 2020, and to Chinese Patent Application No. 202010066148.0 filed Jan. 20, 2020. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the field of two-dimensional (2D) nanomaterials and nano-devices, and more particularly to a method to space-confined synthesis of ultrathin two-dimensional nanosheets, and application thereof.

2D materials are mainly obtained through mechanical exfoliation, chemical vapor deposition (CVD), molecular beam epitaxy (MBE), pulsed laser deposition (PLD) and so on. And CVD is the cheapest preparation method to realize the large-area growth of 2D monocrystalline. Production of a wafer-scale monolayer graphene and hexagonal boron nitride (h-BN) on Cu foils had been achieved by CVD. However, the current CVD method is only suitable for a few kinds of materials with weak interlayer forces. Material systems such as halides, oxides, and polycompounds are hard to be prepared by conventional CVD.

SUMMARY

The disclosure provides a method to space-confined synthesis of ultrathin two-dimensional (2D) nanosheets. The disclosure employs halogen source ($BiX_3$; X=I, Br, Cl) to form a micro-nano scale confined space between metal and substrate by using CVD method. The ultrathin 2D nanosheets is then produced by adjusting the temperature and time of the reaction. The method of the disclosure is widely applicable to the growth of 2D materials including: 2D oxides, halogen compounds and halogen oxides, which is processed by adjusting the growth time, gas flow rate and source quality. The synthesized ultrathin 2D nanosheets has monocrystalline characteristics and optoelectronic device performance.

According to a first aspect of the disclosure, there is provided a method for preparing ultrathin two-dimensional monocrystalline nanosheets by metal-assisted self-confined space, the method comprising:

1) placing $BiX_3$ powder (where X=I, Br, or Cl) in a crucible, and putting the crucible in a first heating zone of a furnace disposed at a gas inlet of a quartz tube; placing substrate covered with metal sheets in a second heating zone of the furnace disposed at a gas outlet of the quartz tube;

2) vacuumizing the quartz tube by a mechanical pump; pumping Ar gas into the quartz tube until a gas pressure is equal to 101.325 kPa; pumping a carrier gas into the quartz tube and adjusting and maintaining a constant flow rate of the carrier gas; and 3) heating and maintaining the second heating zone; heating the first heating zone to evaporate $BiX_3$ until the ultrathin 2D nanosheets are formed on the substrate, and cooling the substrate naturally to 15-30° C.

Further, the metal sheets are unoxidized transition metal sheets or naturally oxidized transition metal sheets.

Further, the transition metal sheet is a copper sheet or an iron sheet.

Further, the naturally oxidized transition metal sheets are obtained by placing the transition metal sheets in air at room temperature (15-30° C.) for 1-2 days.

The disclosure also provides a method for preparing a photodetector comprising the ultrathin 2D monocrystalline nanosheets, comprising: covering mask plate on the 2D ultrathin monocrystalline nanosheets, and depositing an electrode by thermal evaporation.

According to a second aspect of the disclosure, there is provided a method for preparing an ultrathin 2D monocrystalline CuBr nanosheet, comprising:

1) placing $BiBr_3$ powder in a crucible, and putting the crucible on a first heating zone of a furnace disposed at a gas inlet of a quartz tube; placing substrates covered with copper sheets on a second heating zone of the furnace disposed at a gas outlet of the quartz tube; wherein a gap between the copper sheets and the substrates is 0-100 μm;

2) vacuumizing the quartz tube to less than 0.1 Pa; pumping Ar gas into the quartz tube until a gas pressure is equal to one atmosphere pressure; pumping mixed gas of Ar and $H_2$ to the quartz tube and adjusting and maintaining a steady flow rate of the mixed gas;

3) heating the second heating zone to a temperature of 275-325° C. and keeping the temperature for 10-60 min; heating the first heating zone to 200-275° C. for 3-20 min to evaporate the $BiBr_3$ powder until ultrathin 2D CuBr nanosheets are formed on the substrate; and cooling the substrate naturally to 15-30° C.

Further, the substrate in 1) is a substrate with van der Waals force, specifically a mica or graphene substrate; the mass of the $BiBr_3$ powder is 2-200 mg.

Further, in the mixed gas in 2), 0% the volume of $H_2 \leq 10\%$, and the flow rate of the mixed gas is 50-100 sccm.

The disclosure also provides ultrathin 2D monocrystalline CuBr nanosheets with thickness of 0.9-200 nm and length size of 2-150 μm, prepared in accordance with the method described above.

The disclosure also provides a method for preparing a UV photodetector comprising the ultrathin 2D monocrystalline CuBr nanosheets, comprising: depositing a silver electrode with a thickness of 25-100 nm using a copper mesh as a mask on the two-dimensional ultrathin monocrystalline CuBr nanosheet.

According to a third aspect of the disclosure, there is provided a method for preparing ultrathin 2D monocrystalline $Fe_3O_4$ nanosheets, comprising:

1) placing $BiI_3$ powder in a crucible, and putting the crucible in a first heating zone of a furnace disposed at a gas inlet of a quartz tube; placing substrates covered with naturally oxidized iron sheets in a second heating zone of the furnace disposed at a gas outlet of the quartz tube;

2) vacuumizing the quartz tube to less than 1 Pa; pumping Ar gas into the quartz tube until a gas pressure is equal to one atmosphere pressure; continuously pumping the Ar gas to the quartz tube with a flow velocity of 10-75 sccm;

3) heating the second heating zone to a temperature of 370-450° C. and keeping the temperature for 10-60 min; heating the first heating zone to 450-520° C. for 5-20 min to evaporate the $BiI_3$ powder until ultrathin 2D $Fe_3O_4$ nanosheets are formed on the substrate and cooling the substrate naturally to 15-30° C., thereby yielding a two-dimensional ultrathin monocrystalline $Fe_3O_4$ nanosheet.

Further, the mass of the $BiI_3$ powder in 1) is 1-20 mg, and the substrate is mica substrate.

Further, the naturally oxidized iron sheets in 1) are obtained by placing the iron sheets in air at room temperature (15-30° C.) for 1 to 2 days.

Further, the heating rate of the second heating zone 3) is 10-25° C./min; the heating rate of the first heating zone is 15-25° C./min.

The disclosure also provides ultrathin 2D monocrystalline $Fe_3O_4$ nanosheets prepared in accordance with the method described above, with a thickness of 1.95-100 nm, and the length size of 1-20 μm.

The disclosure also provides a method for preparing a photodetector comprising the ultrathin 2D monocrystalline $Fe_3O_4$ nanosheets, comprising: transferring the ultrathin 2D monocrystalline $Fe_3O_4$ nanosheets from the mica substrate onto an $Si/SiO_2$ substrate, and depositing an electrode by electron beam exposure and thermal evaporation. The electrode comprises a Cr layer with a thickness of 1-10 nm and an Au layer with a thickness of 10-100 nm.

According to a fourth aspect of the disclosure, there is provided a method for preparing an ultrathin 2D monocrystalline BiOBr nanosheet, the method comprising:

1) placing $BiBr_3$ powder in a crucible, and putting the crucible on a first heating zone of a furnace disposed at a gas inlet of a quartz tube; placing substrates covered with naturally oxidized copper sheets on a second heating zone of the furnace disposed at a gas outlet of the quartz tube;

2) vacuumizing the quartz tube to less than 0.1 Pa; pumping Ar gas into the quartz tube until an air pressure is equal to one atmosphere pressure; continuously pumping the Ar gas to the quartz tube with a flow velocity of 25-50 sccm;

3) heating the second heating zone to a temperature of 380-400° C. and keeping the temperature for 1-60 min; heating the first heating zone to 220-275° C. for 5-30 min until producing chemical reaction between $BiI_3$ and metal sheets, and preparing ultrathin 2D nanosheets on the substrates simultaneously; and cooling the substrate naturally to 15-30° C., thereby yielding a two-dimensional ultrathin monocrystalline BiOBr nanosheet.

Further, the mass of the $BiBr_3$ powder in 1) is 2-50 mg.

Further, the naturally oxidized copper sheets in 1) are obtained by placing the copper sheets in the air at room temperature (15-30° C.) for 1 to 2 days.

Further, the heating rate of the second heating zone in 3) is 10-25° C./min; the heating rate of the first heating zone is 15-30° C./min.

Further, the cooling in 3) refers to the operation of natural cooling or rapid cooling, and the rate of the rapid cooling ≥50° C./min.

The disclosure also provides a thin 2D monocrystalline BiOBr nanosheets in accordance with the method described above, with a crystal growth surface of (00l), a thickness of 0.57 nm-200 nm, and a size of 0.5-70 nm.

The disclosure also provides a method for preparing a photodetector comprising the ultrathin 2D monocrystalline BiOBr nanosheets, comprising: transferring the ultrathin monocrystalline BiOBr nanosheets with thickness of 0.57-20 nm onto the silicon substrate by wet transfer method, and manufacturing an electrode by electron beam lithography and thermal evaporation.

The mechanism of the disclosure is as follows:

In this disclosure, a micro-nano distance between metal sheet and substrate lead to a high concentration of metal source on the substrate surface, even at low temperature by the principle of thermal diffusion. Meanwhile, the confined space can provide a suitable stable growth environment by reducing the number of Reynolds. In addition, part of metal sheet such as Cu and Fe, can also provide a catalytic role to promote the growth of 2D materials. Halogen source $BiX_3$ (X=I, Br, Cl) is a kind of passivator with low melting point, which can inhibit the growth of 2D materials at the Z axis and assist the formation of 2D in-plane structures. Therefore, this disclosure can realize an effective and stable preparation for a variety of 2D high-quality nanosheets by changing the metal sheet and adjusting the growth parameters.

In conclusion, the beneficial effects of the disclosure are:

1. The disclosure provides a universal method for preparing ultrathin 2D nanosheets based on the metal-sheet self-confined space. Metal sheets and substrates constructed a confined space reduce the Reynolds number and stable growing environment. In addition, the materials grown by the disclosure have a monocrystalline structure.

2. The preparing method of the disclosure realizes controlled growth of various new-type 2D monocrystalline materials such as 2D monocrystalline CuBr nanosheets, $Fe_3O_4$ nanosheets and BiOBr nanosheets. The thickness of CuBr monocrystalline nanosheet is 0.9-200 nm and the size is 2-150 μm. The thickness of $Fe_3O_4$ monocrystalline nanosheet is 1.95-100 nm and the size are 1-20 μm. The thickness of BiOBr monocrystalline nanosheets is 0.57-200 nm, the size is 0.5-70 μm, and the bandgap of monolayer BiOBr materials are up to 3.69 eV.

3. The photodetector based on the 2D ultrathin CuBr nanosheets has self-driven UV light detection performance; the photodetector based on 2D ultrathin $Fe_3O_4$ nanosheets perform a wide spectral response from 375 nm to 10.6 μm at room temperature; the high photoresponsivity is as high as 561.2 A W-1 at the wavelength of 10.6 μm; the photodetector based on 2D ultrathin BiOBr nanosheets perform a distinguished DUV light detection performance from 245 to 405 nm. Significant detecting performance including ultrahigh photoresponsivity of 2021.9 A/W, external quantum efficiency of 1.03×106%, and detectivity of 2.95×1013 Jones can be achieved for 245 nm light.

BRIEF DESCRIPTION OF THE DRAWINGS

FIG. 3A represents the XRD pattern and the PDF card of the sphalerite structure CuBr, FIG. 3B represents the Raman pattern, and FIG. 3C represents the XPS pattern;

FIG. 4A is the uv-visible absorption spectrum, FIG. 4B is the photoluminescence spectrum, and FIG. 4C is the fluorescence life data graph;

FIG. 9 is the Raman diagram of ultrathin 2D monocrystalline $Fe_3O_4$ nanosheets according to Example 5 of the disclosure, including characterization of ultrathin 2D monocrystalline $Fe_3O_4$ nanosheets of different thicknesses and $Al_2O_3$ (sapphire, sapphire) substrates for comparison;

FIG. 10A is the I-Vi-v diagram of the light response of the device at the wavelength of 10.6 and FIG. 10B is the distribution diagram of the light response range;

FIG. 14A is a low resolution TEM image, and FIG. 14B is a high resolution TEM image;

DETAILED DESCRIPTION

To further illustrate the invention, embodiments detailing a method to space-confined synthesis of ultrathin two-dimensional nanosheets are described below. It should be noted that the following embodiments are intended to describe and not to limit the disclosure.

Example 1

A method for preparing ultrathin 2D monocrystalline CuBr nanosheets, the method comprises:

1) placing 10 mg of $BiBr_3$ powder in an $Al_2O_3$ crucible; putting the $Al_2O_3$ crucible in the middle of the first heating zone of a furnace with a quartz tube, which is locating at the gas inlet of the quartz tube; placing a mica substrate covered with copper sheets in the middle of the second heating zone of the quartz tube, which is locating at the gas outlet of the quartz tube; the confined spacing gap between the copper sheets and the substrate is 50 μm;

2) vacuumizing the quartz tube to less than 0.1 Pa; pumping the Ar gas at 500 sccm into the quartz tube to remove the residual air in the tube, until the air pressure is equal to atmosphere pressure; pumping the $Ar/H_2$ mixture gas, which takes up 5% of $H_2$ volume, and the flow velocity of the mixture gas is 50 sccm;

3) heating the second heating zone to 325° C. within 15 min and keeping the temperature for 15 min; heating the first heating zone to 200° C. within 10 min and keeping the temperature for 5 min; evaporating the $BiBr_3$ powder until ultrathin 2D monocrystalline CuBr nanosheets are formed on the substrate; and cooling the substrate naturally to 30° C.

The method for preparing a photodetector comprising the nanocrystalline CuBr nanosheets, comprising the following steps of: covering a 600-mesh nickel grid on the ultrathin 2D nanocrystalline CuBr nanosheets, and depositing Ag electrodes with thickness of 50 nm on the surface of the ultrathin 2D nanocrystalline CuBr sheets by hot evaporation.

Figure 2:
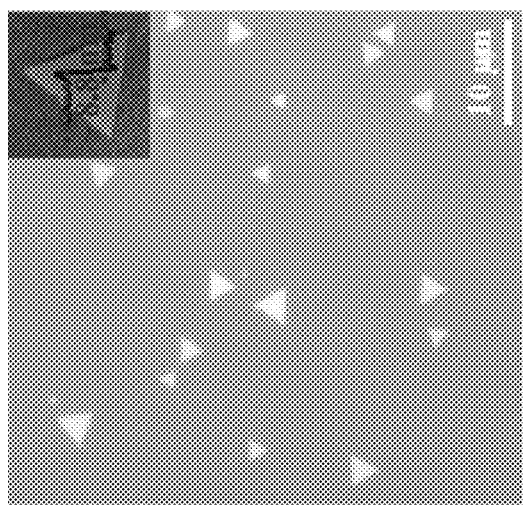
FIG. 2 is the optical micrograph of ultrathin 2D monocrystalline CuBr nanosheets according to Example 1 of the disclosure, and the corresponding AFM characterization diagram is illustrated in the upper right corner.
Figure 4A:
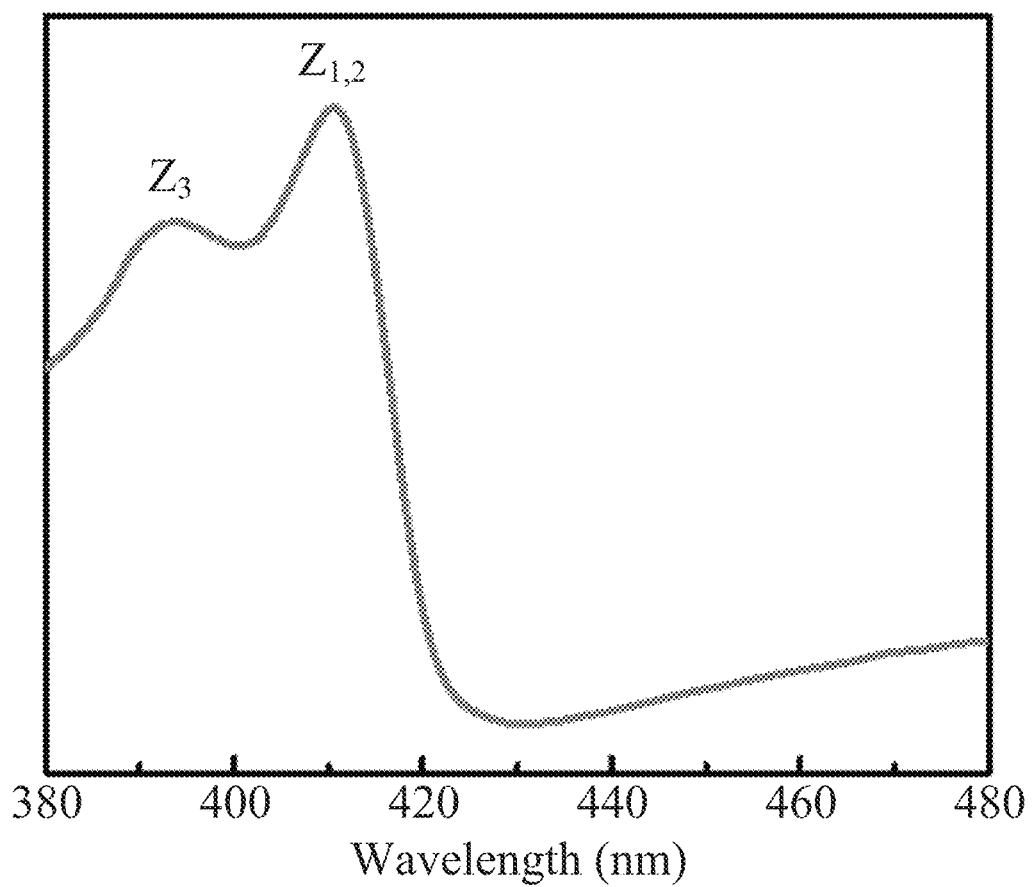
FIGS. 4A-4C are the optical characterization diagrams of ultrathin 2D monocrystalline CuBr nanosheets according to Example 1 of the disclosure.
Figure 4B:
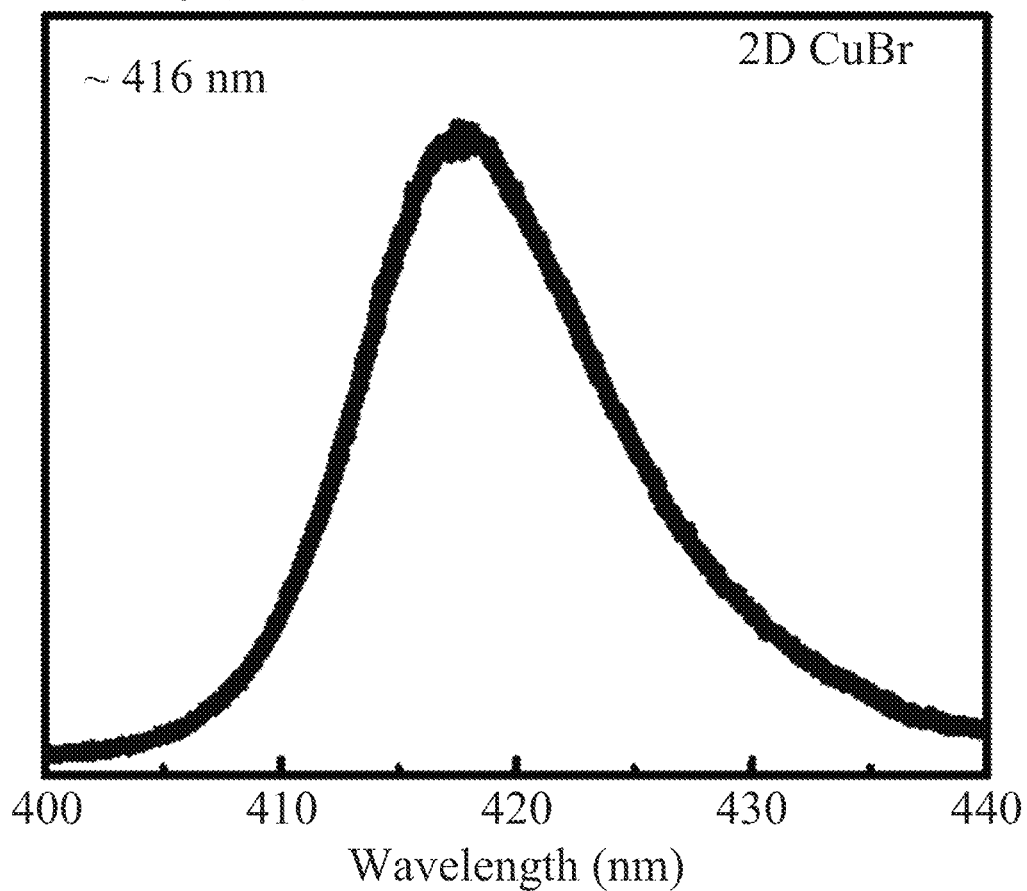
Figure 4C:
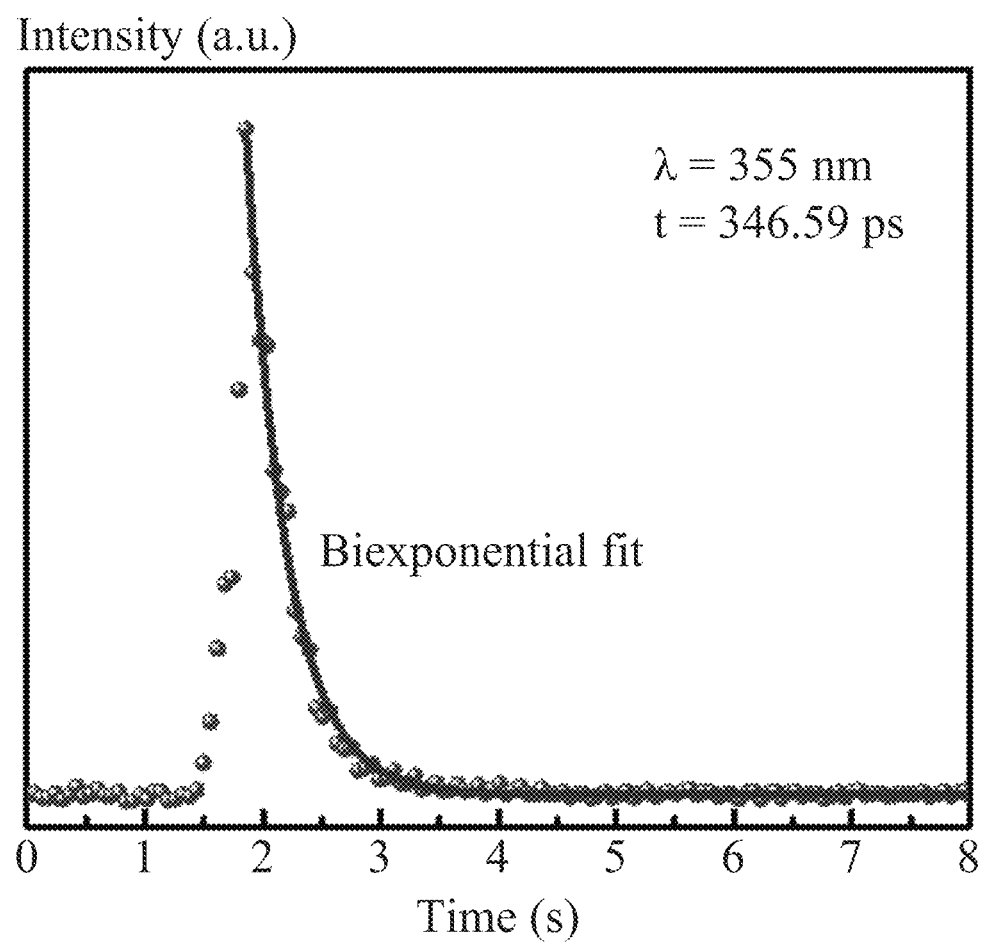
Figure 5:
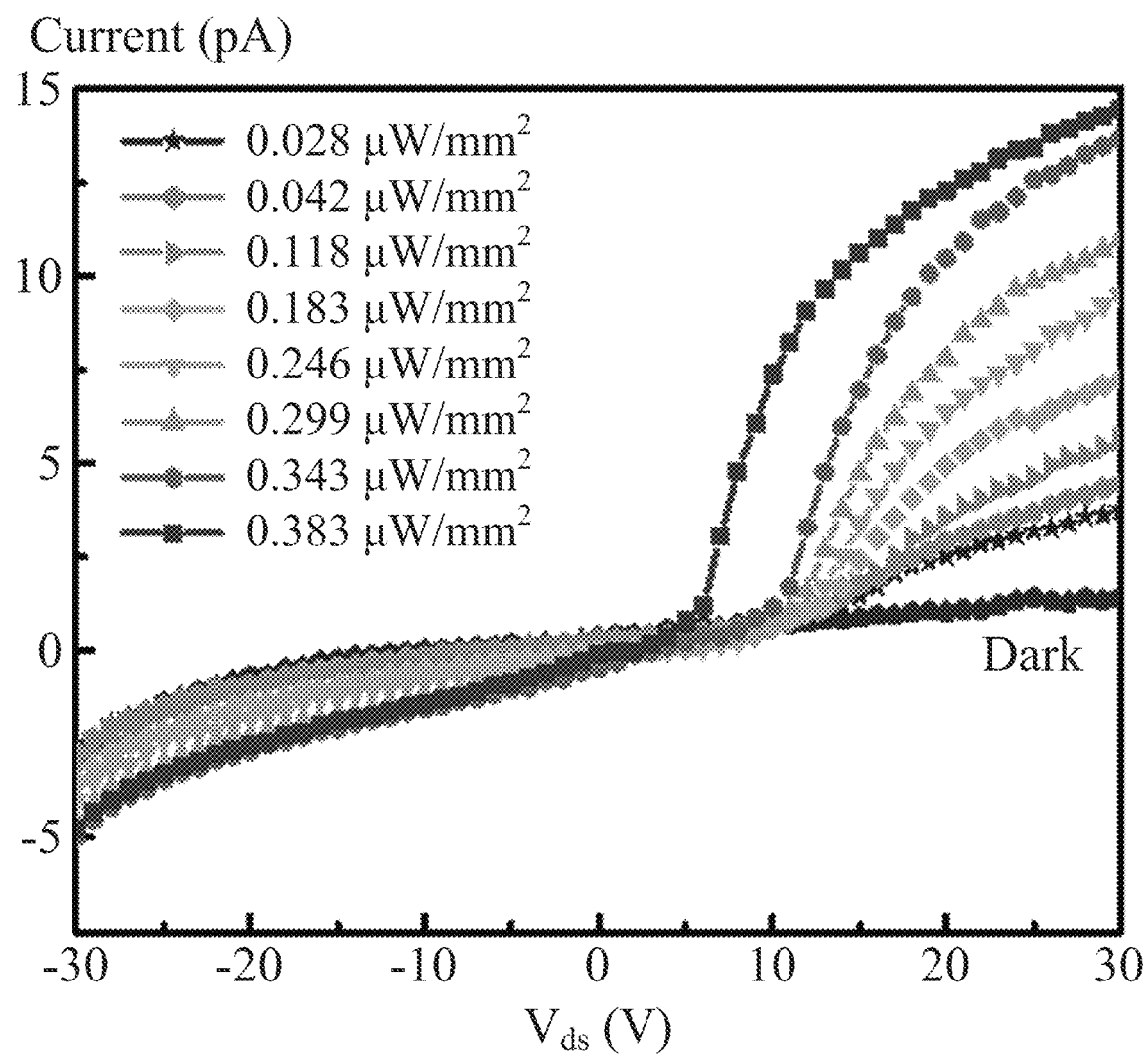
FIG. 5 is an I-V diagram of the optical response of a photodetector component prepared by ultrathin 2D monocrystalline CuBr nanosheets under different optical powers according to Example 1 of the disclosure.

The optical micrograph of the ultrathin 2D monocrystalline CuBr nanosheet prepared by Example 1 is shown in FIG. 2; the structure and element characterization diagram is shown in FIG. 3, and the optical performance characterization diagram is shown in FIG. 4. The optical response I-V diagram of a photodetector comprising the monocrystalline CuBr nanosheets under different light powers is shown in FIG. 5.

Example 2

A method for preparing ultrathin 2D monocrystalline CuBr nanosheets, the method comprises:

1) placing 10 mg of $BiBr_3$ powder in an $Al_2O_3$ crucible; putting the $Al_2O_3$ crucible in the middle of the first heating zone of a furnace with a quartz tube, which is locating at the gas inlet of the quartz tube; placing a mica substrate covered with copper sheets in the middle of the second heating zone of the quartz tube, which is locating at the gas outlet of the quartz tube; the confined spacing gap between the copper sheets and the substrate is 0 μm;

2) vacuumizing the quartz tube to less than 0.1 Pa; pumping the Ar gas at 500 sccm into the quartz tube to remove the residual air in the tube, until the air pressure is equal to atmosphere pressure; pumping the $Ar/H_2$ mixture gas, which takes up 5% of $H_2$ volume, and the flow velocity of the mixture gas is 50 sccm;

3) heating the second heating zone to 325° C. within 15 min and keeping the temperature for 15 min; then heating the first heating zone to 220° C. within 10 min and keeping the temperature for 5 min; evaporating the $BiBr_3$ powder until ultrathin 2D monocrystalline CuBr nanosheets are formed on the substrate; and cooling the substrate naturally to 30° C.

Figure 6:
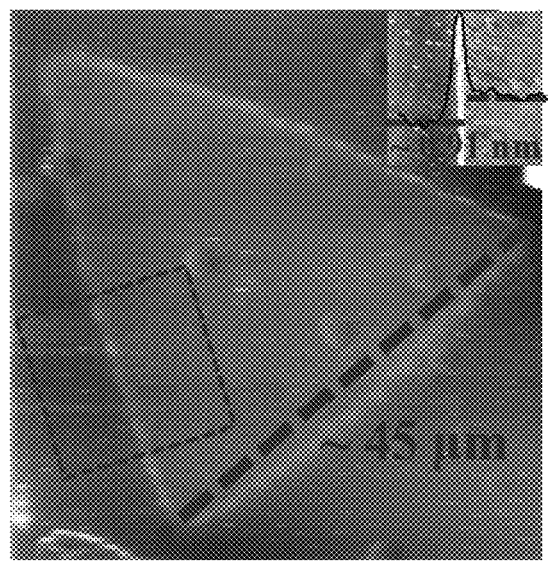
FIG. 6 is an AFM scanning diagram of ultrathin 2D monocrystalline CuBr nanosheets according to Example 2 of the disclosure, and the AFM scanning diagram in the corresponding box is illustrated in the upper right corner.

The AFM scanning diagram of monocrystalline CuBr nanosheets according to Example 2 is shown in FIG. 6.

Example 3

A method for preparing ultrathin 2D monocrystalline CuBr nanosheets, the method comprises:

1) placing 50 mg of $BiBr_3$ powder in an $Al_2O_3$ crucible, then putting the $Al_2O_3$ crucible in the middle of the first heating zone of a furnace with a quartz tube, which is locating at the gas inlet of the quartz tube; placing a mica substrate covered with copper sheets in the middle of the second heating zone of the quartz tube, which is locating at the gas outlet of the quartz tube; the confined spacing gap between the copper sheets and the substrate is 25 μm;

2) vacuumizing the quartz tube to less than 0.1 Pa; pumping the Ar gas at 500 sccm into the quartz tube to remove the residual air in the tube, until the air pressure is equal to atmospheric pressure; pumping the $Ar/H_2$ mixture gas, which takes up 5% of $H_2$ volume, and the flow velocity of the mixture gas is 75 sccm;

3) heating the second heating zone to 305° C. within 15 min and keeping the temperature for 15 min; heating the first heating zone to 275° C. within 10 min and keeping the temperature for 5 min; evaporating the $BiBr_3$ powder until ultrathin 2D monocrystalline nanosheets on the substrates simultaneously; and cooling the substrate naturally to 30° C.

Example 4

Ultrathin 2D monocrystalline CuBr nanosheets were prepared in accordance with the method of Example 2, except that the spacing between the copper sheets and the mica substrate in 1) was adjusted to 100 μm while remaining unchanged in other steps.

The thickness of monocrystalline CuBr nanosheets prepared in Example 4 is up to 200 nm.

Example 5

A method for preparing ultrathin 2D monocrystalline $Fe_3O_4$ nanosheets, the method comprises:

1) placing 10 mg of $BiI_3$ powder in an $Al_2O_3$ crucible, then putting the $Al_2O_3$ crucible in the middle of the first heating zone of a furnace with a quartz tube, which is locating at the gas inlet of the quartz tube; placing a mica substrate covered with naturally oxidized iron sheets in the middle of the second heating zone of the quartz tube, which is locating at the gas outlet of the quartz tube;

2) vacuumizing the quartz tube to less than 1 Pa; pumping the Ar gas into the quartz tube until the air pressure is equal to atmospheric pressure; after that, pumping the Ar gas as a current-carrying gas with a flow rate of 50 sccm;

3) heating the second heating zone to 400° C. and keeping the temperature for 20 min; heating the first heating zone to 470° C. for 10 min, and evaporating the $BiI_3$ powder until ultrathin 2D nanosheets are formed on the mica substrate; and cooling the substrate naturally to 15° C.

The method for preparing a photodetector comprising the ultrathin 2D monocrystalline $Fe_3O_4$ nanosheets, comprising: transferring the $Fe_3O_4$ monocrystalline nanosheets from the mica substrate onto a $Si/SiO_2$ substrate, and depositing a Cr electrode with a thickness of 5 nm and an Au electrode with a thickness of 50 nm by electron beam exposure and thermal evaporation.

Figure 7:
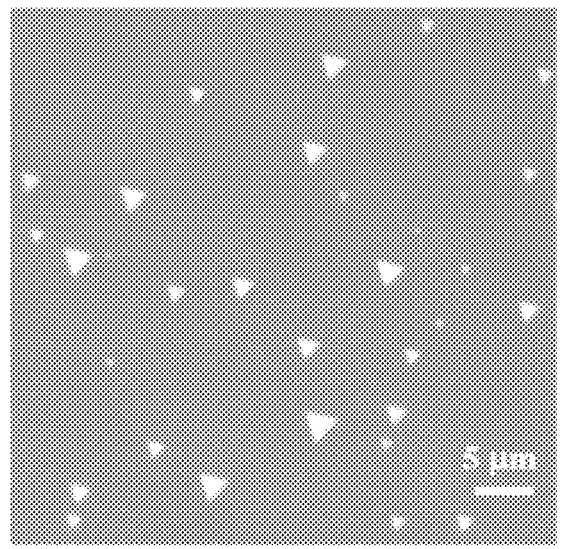
FIG. 7 is an optical micrograph of ultrathin 2D monocrystalline $Fe_3O_4$ nanosheets according to Example 5 of the disclosure.
Figure 8:
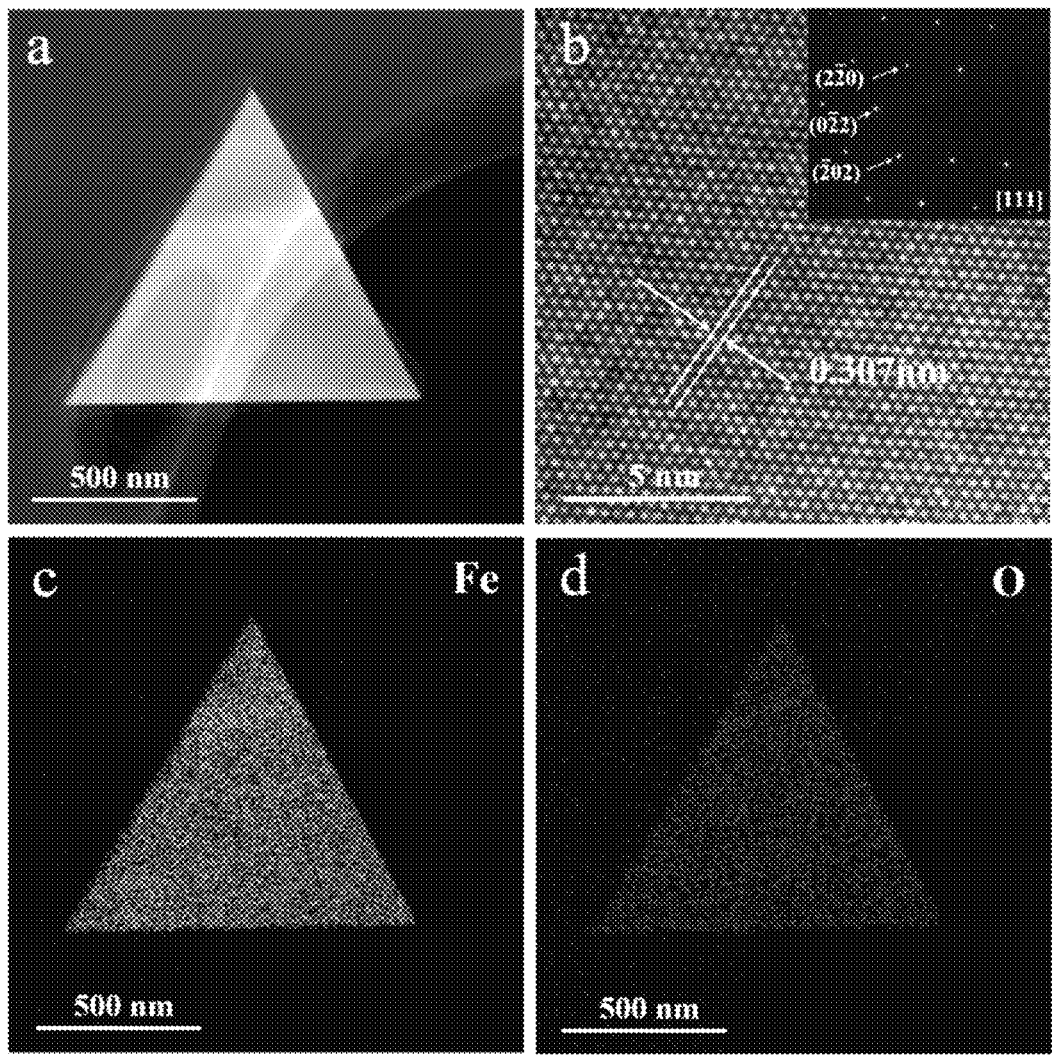
FIG. 8 is the TEM image of ultrathin 2D monocrystalline $Fe_3O_4$ nanosheets according to Example 5 of the disclosure; (a) is low-resolution images of ultrathin 2D monocrystalline $Fe_3O_4$ nanosheets, (b) is high-resolution images of ultrathin 2D monocrystalline $Fe_3O_4$ nanosheets, and (c) and (d) are EDS-mappings.

The optical micrograph of monocrystalline $Fe_3O_4$ nanosheets prepared by this Example is shown in FIG. 7, the TEM image is shown in FIG. 8, the Raman spectrogram is shown in FIG. 9, and the photoelectric performance test diagram of the infrared detector based on monocrystalline $Fe_3O_4$ nanosheets is shown in FIG. 10.

Example 6

The ultrathin 2D monocrystalline $Fe_3O_4$ nanosheets were prepared in accordance with Example 5. The temperature in the first heating zone and the second heating zone in 3) was only adjusted to 520° C. and 420° C., respectively, and kept for 1 hour, while remaining unchanged in other steps.

Figure 11:
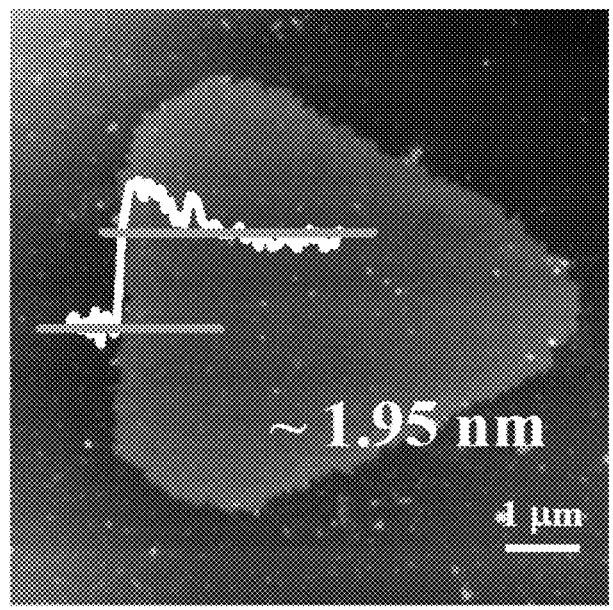
FIG. 11 is an AFM scanning diagram of ultrathin 2D monocrystalline $Fe_3O_4$ nanosheets according to Example 6 of the disclosure.

The AFM scanning diagram of monocrystalline $Fe_3O_4$ nanosheets prepared by Example 6 is shown in FIG. 11.

Example 7

A method for preparing ultrathin 2D monocrystalline $Fe_3O_4$ nanosheets, the method comprises:

1) placing 10 mg of $BiI_3$ powder in an $Al_2O_3$ crucible; putting the $Al_2O_3$ crucible in the middle of the first heating zone of a furnace with a quartz tube, which is locating at the gas inlet of the quartz tube; placing a mica substrate covered with naturally oxidized iron sheets in the middle of the second heating zone of the quartz tube, which is locating at the gas outlet of the quartz tube;

2) vacuumizing the quartz tube to less than 1 Pa; pumping Ar gas at a flow rate of 500 sccm into the quartz tube until the air pressure is equal to atmosphere pressure; and pumping the Ar gas as a current-carrying gas with a flow rate of 75 sccm;

3) heating the second heating zone to 390° C. and keeping the temperature for 20 min; heating the first heating zone to 460° C. for 20 min; evaporating the $BiI_3$ powder until ultrathin 2D monocrystalline $Fe_3O_4$ nanosheets are formed on the substrates; and cooling the substrate naturally to 15° C.

The ultrathin 2D monocrystalline $Fe_3O_4$ nanosheets prepared by this Example has a thickness up to 100 nm.

Comparison Example 1

The 2D ultrathin monocrystalline $Fe_3O_4$ nanosheets were prepared in accordance with Example 5, but not placing $BiI_3$ powder in 1), and other steps remained unchanged.

The contrast Example 1 shows that the ultrathin 2D monocrystalline $Fe_3O_4$ nanosheets fail to grow on the mica substrate.

Comparison Example 2

The ultrathin 2D monocrystalline $Fe_3O_4$ nanosheets were prepared in accordance with Example 7. In 3), the temperatures of the first heating zone and the second heating zone were respectively adjusted to 400° C. and 500° C., while remaining unchanged in other steps.

The Contrast Example 2 shows that the ultrathin 2D monocrystalline $Fe_3O_4$ nanosheets fail to grow on the mica substrate.

$Fe_2O_3$ is formed when the iron sheets are exposed to oxygen and moisture to generate the naturally oxidized iron sheets. In a high vacuum tube furnace, Ar carrier gas is used to purge oxygen and create a high-temperature environment during the heating process. The ultrathin 2D monocrystalline $Fe_3O_4$ nanosheets grows in an interlayer space confined between the naturally oxidized iron sheets and the mica substrate. $BiI_3$, as a passivator, inhibits growth of the non-layered nanosheets along the c-axis by inhibiting the unsaturated suspension bond on the surface of the nanosheets.

Example 8

A method for preparing ultrathin 2D monocrystalline BiOBr nanosheets, the method comprises:

1) placing 10 mg of $BiBr_3$ powder in an $Al_2O_3$ crucible; putting the $Al_2O_3$ crucible in the middle of the first heating zone of a furnace with a quartz tube, which is locating at the gas inlet of the quartz tube; placing a mica substrate covered with naturally oxidized copper sheets in the middle of the second heating zone of the quartz tube, which is locating at the gas outlet of the quartz tube;

2) vacuumizing the quartz tube to less than 0.1 Pa; pumping Ar gas into the quartz tube until the air pressure is equal to atmosphere pressure; and pumping Ar gas as a carrier gas, with the flow velocity of 25 sccm;

3) heating the second heating zone to 385° C. and keeping the temperature for 10 min; heating the first heating zone to 220° C. for 30 min; evaporating the $BiBr_3$ powder until ultrathin 2D monocrystalline BiOBr nanosheets are formed on the mica substrates; and cooling the substrate to room temperature at a cooling rate of 50° C./min.

Figure 12:
FIG. 12 is the dark field optical micrograph of ultrathin 2D monocrystalline BiOBr nanosheets according to Example 8 of the disclosure.
Figure 13:
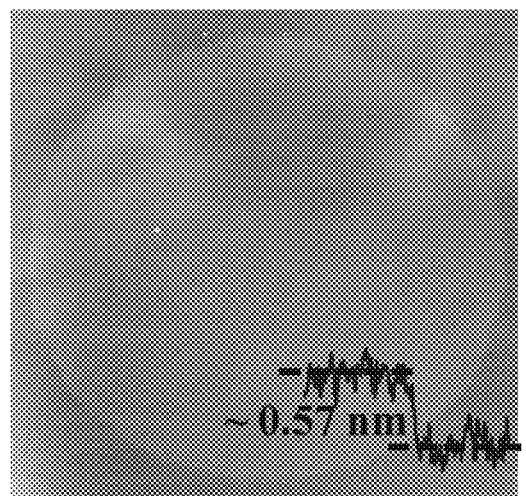
FIG. 13 is the AFM diagram of ultrathin 2D monocrystalline BiOBr nanosheets according to Example 8 of the disclosure.

The dark field optical micrograph of the ultrathin 2D monocrystalline BiOBr nanosheets prepared by this embodiment is shown in FIG. 12, and the AFM diagram is shown in FIG. 13.

Example 9

A method for preparing ultrathin 2D monocrystalline BiOBr nanosheets, the method comprises:

1) placing 50 mg of $BiBr_3$ powder in an $Al_2O_3$ crucible; putting the $Al_2O_3$ crucible on the first heating zone of a furnace with a quartz tube, which is locating at the gas inlet of the quartz tube; placing a mica substrate covered with naturally oxidized copper sheets on the second heating zone of the quartz tube, which is locating at the gas outlet of the quartz tube;

2) vacuumizing the quartz tube to less than 0.1 Pa; pumping Ar gas into the quartz tube until the air pressure is equal to atmosphere pressure; after that, pumping Ar gas as a carrier gas, with the flow velocity of 50 sccm;

3) heating the second heating zone to 385° C. and keeping the temperature for 30 min; heating the first heating zone to 275° C. for 30 min; evaporating the $BiBr_3$ powder until ultrathin 2D nanosheets are formed on the mica substrate; and the cover of the CVD furnace was opened to rapidly cool the quartz tube to room temperature.

Figures 14A, 14B:
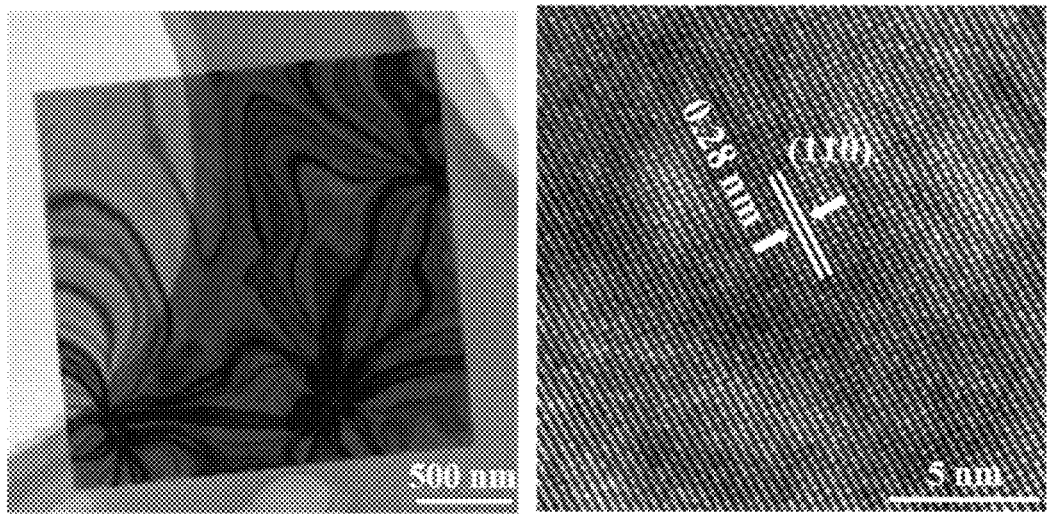
FIGS. 14A-14B are the TEM diagrams of ultrathin 2D monocrystalline BiOBr nanosheets according to Example 9 of the disclosure.
Figure 15:
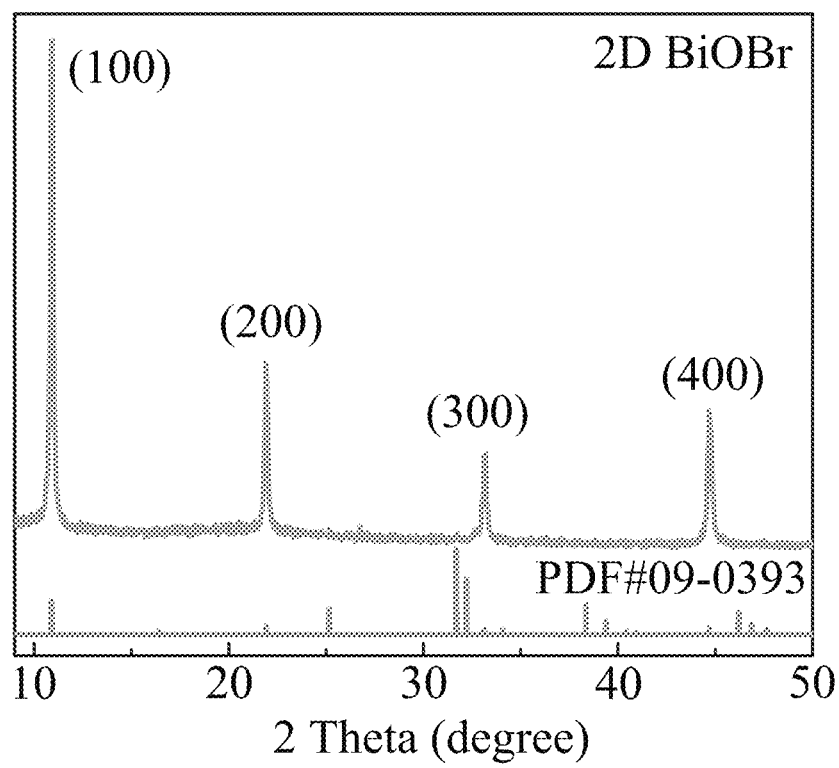
FIG. 15 is the XRD pattern of ultrathin 2D monocrystalline BiOBr nanosheets according to Example 9 of the disclosure.
Figure 16:
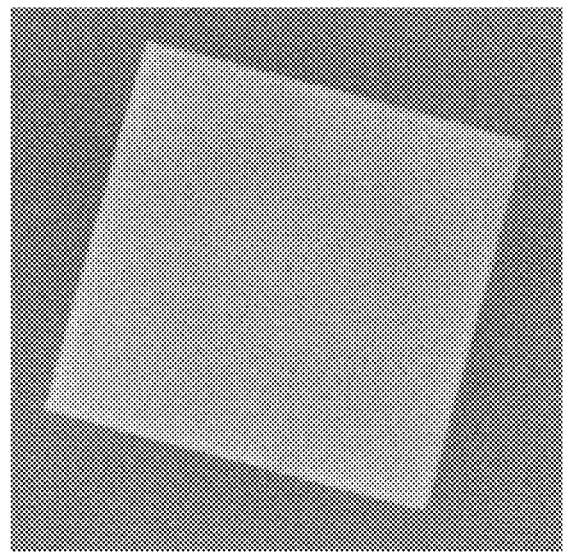
FIG. 16 is the SEM diagram of ultrathin 2D monocrystalline BiOBr nanosheets according to Example 9 of the disclosure.

The TEM image of the ultrathin 2D monocrystalline BiOBr nanosheets prepared by Example 9 is shown in FIG. 14. The XRD pattern is shown in FIG. 15, SEM image is shown in FIG. 16.

Example 10

A method for preparing ultrathin 2D monocrystalline BiOBr nanosheets, the method comprises:

1) placing 10 mg of $BiBr_3$ powder in an $Al_2O_3$ crucible, then putting the $Al_2O_3$ crucible in the middle of the first heating zone of a furnace with a quartz tube, which is locating at the gas inlet of the quartz tube; placing a mica substrate covered with naturally oxidized copper sheets in the middle of the second heating zone of the quartz tube, which is locating at the gas outlet of the quartz tube;

2) vacuumizing the quartz tube to less than 0.1 Pa; pumping Ar gas into the quartz tube until the air pressure is equal to atmosphere pressure; after that, pumping Ar gas as a carrier gas, with the flow velocity of 37 sccm;

3) heating the second heating zone to 385° C. and keeping the temperature for 30 min; heating the first heating zone to 250° C. for 30 min; evaporating the $BiBr_3$ powder until ultrathin 2D nanosheets are formed on the substrates; and cooling the mica substrate to room temperature at a cooling rate of 80° C./min.

A method for preparing a UV photodetector comprising the ultrathin 2D monocrystalline BiOBr nanosheets, comprising: transferring the ultrathin 2D BiOBr nanosheets with thickness of 0.57-5 nm from the mica substrate onto a silicon substrate by wet transfer method; spinning a layer of primary polymethyl methacrylate (PMMA) photoresist onto the silicon substrate; etching a designed pattern on the layer of the PMMA resist by electron beam lithography; depositing a Cr/Au electrode on the silicon substrate (i.e., a Cr electrode with a thickness of 10 nm and an Au electrode with a thickness of 50 nm) by evaporation; soaking the silicon substrate in acetone solution to remove photoresist, thereby obtaining a UV photodetector comprising the ultrathin 2D monocrystalline BiOBr nanosheets.

Figure 17:
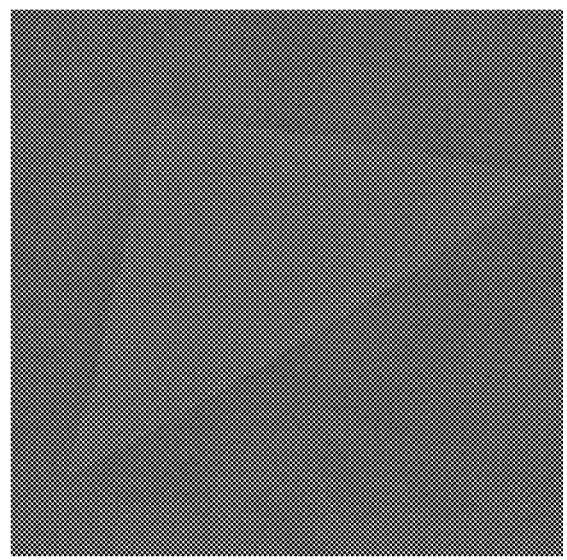
FIG. 17 is the SEM diagram of ultrathin 2D monocrystalline BiOBr nanosheets according to Example 10 of the disclosure.
Figure 18:
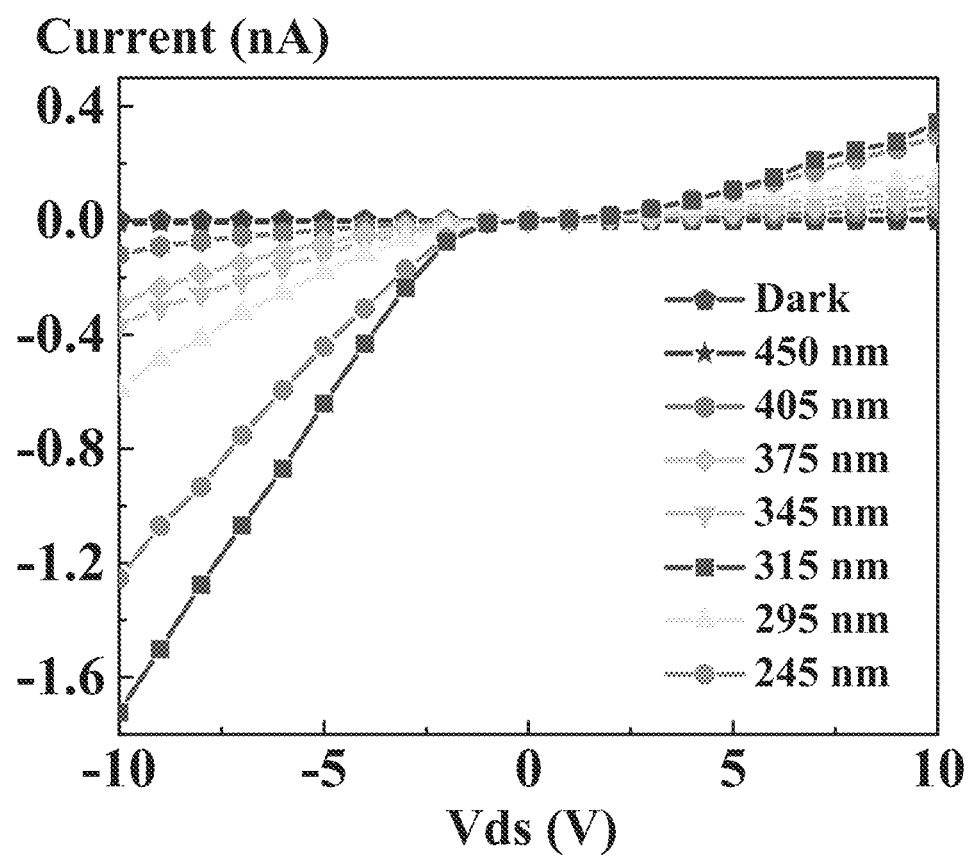
FIG. 18 shows the I-V diagram of the light response of a photodetector comprising the ultrathin 2D monocrystalline BiOBr nanosheets according to Example 10 of the disclosure under different wavelengths of light.
Figure 19:
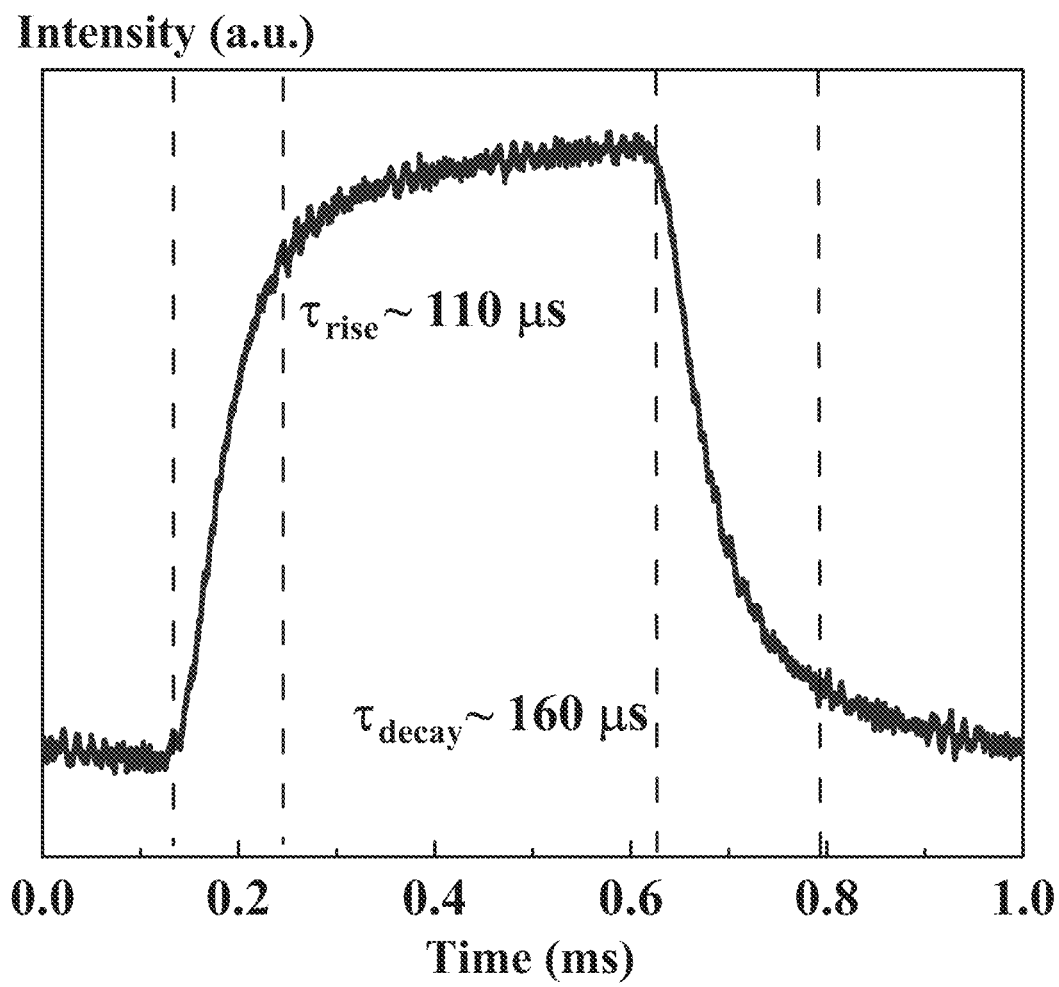
FIG. 19 is the I-T diagram of the light response at a single frequency of a photodetector prepared by ultrathin 2D monocrystalline BiOBr nanosheets under high-frequency illumination according to Example 10 of the disclosure.

The SEM diagram of ultrathin 2D monocrystalline BiOBr nanosheets prepared by Example 10 is shown in FIG. 17. The I-V diagram of the photodetector prepared by monocrystalline BiOBr nanosheets based on Example 10 under different wavelengths of light is shown in FIG. 18. The I-T diagram of the light response at a single frequency of the photodetector prepared based on the monocrystalline BiOBr nanosheets obtained in Example 10 is shown in FIG. 19.

The BiOBr materials prepared by Example 10 have the high-performance UV detection capability due to high light gain, which can be ascribed to the photogating effect existing in the low dimension material. The trap state constrained the photoproduction minority carrier, prolong the lifetime of majority carrier, so as to improve the value of photocurrent, which makes the photoelectric detector based on the material preparation in the deep ultraviolet high responsibility, high external quantum efficiency and high detectivity.

Figure 1:
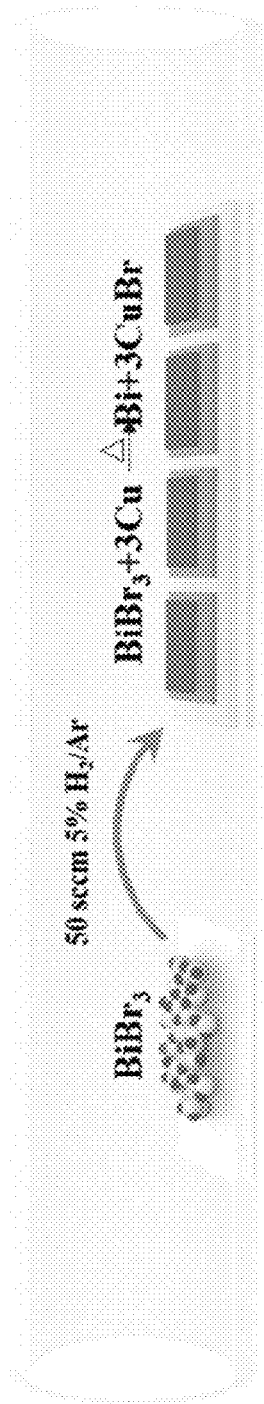
FIG. 1 is a schematic diagram of the ultrathin 2D monocrystalline CuBr nanosheets growth device of Example 1 of the disclosure.
Figure 3A:
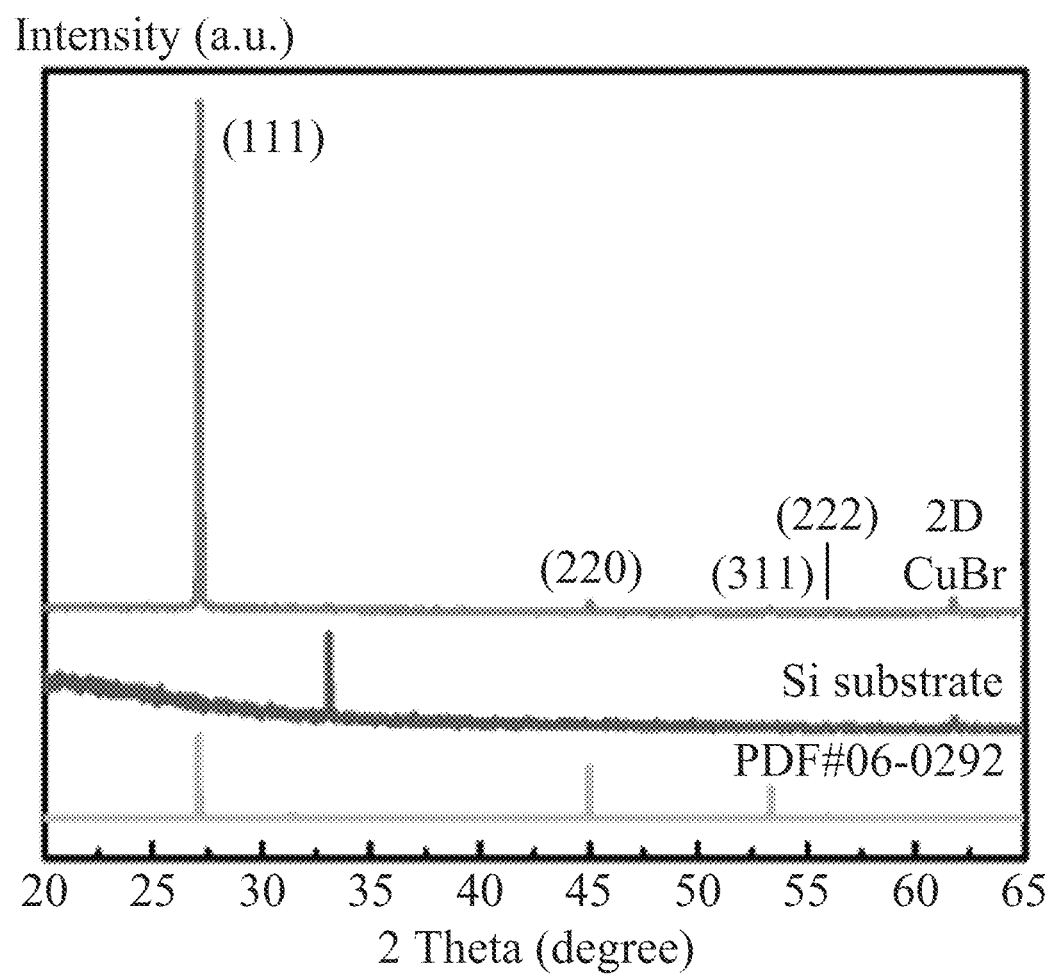
FIGS. 3A-3C are the structure and element characterization diagrams of ultrathin 2D monocrystalline CuBr nanosheets according to Example of the disclosure.
Figure 3B:
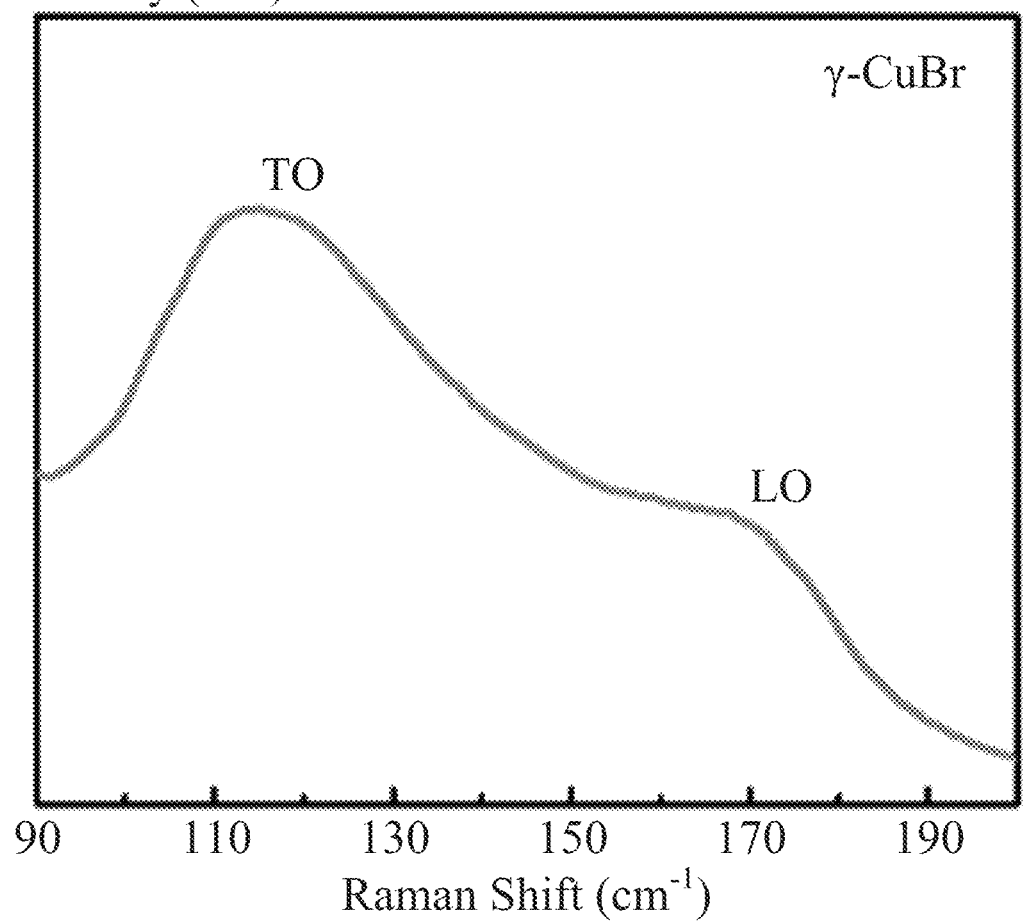
Figure 3C:
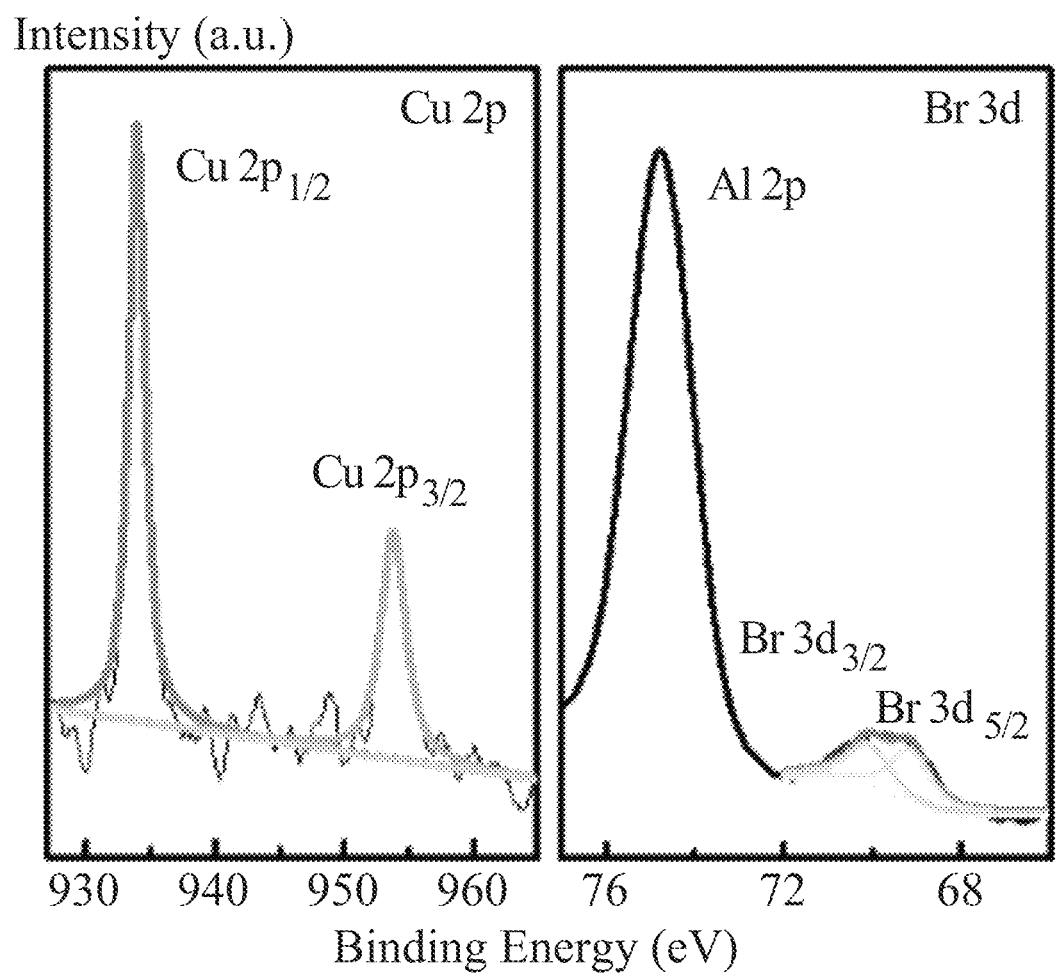

FIG. 1 is schematic illustration of the synthesis of ultrathin 2D monocrystalline CuBr nanosheets by self-confined CVD method. The $Al_2O_3$ crucible and the quartz plate are respectively placed at the two heating zones of the quartz tube.=The $Al_2O_3$ crucible filled with $BiBr_3$ powder source is placed in the center of the first heating zone of the quartz tube, which is locating at the gas inlet of the quartz tube. The mica substrate covered with copper sheet is placed on a quartz plate, and the quartz plate is placed in the center of the second heating zone of the quartz plate. Upon heating, the $BiBr_3$ powder source enters the gap between the copper sheets and the mica substrate along the direction of the air flow and reacts with the copper sheets, and the ultrathin 2D monocrystalline nanosheets are deposited on the mica substrate. FIG. 2 is the optical micrograph of the ultrathin 2D monocrystalline nanosheets prepared by Example 1. It can be seen that the triangular ultrathin 2D monocrystalline CuBr nanosheets with a thickness of 8.8 nm and a size=4 μm are uniformly generated on the surface of the mica substrate. FIGS. 3A-3C are the structure and element characterization diagram of ultrathin 2D monocrystalline CuBr nanosheets prepared by Example 1 of the disclosure. FIG. 3A shows the XRD pattern of ultrathin 2D monocrystalline CuBr nanosheets. It can be seen that the diffraction peaks fully conform to the PDF card of CuBr, proving that the obtained material is CuBr with sphalerite structure. FIG. 3B shows the Raman peak position of the ultrathin 2D monocrystalline CuBr nanosheets, which is consistent with that of CuBr with sphalerite structure. FIG. 3C shows the XPS analysis data, and the four peaks in the figure are Cu 2p1/2, Cu 2p3/2, Br 3d3/2 and Br 3d5/2. Besides, there is no satellite peaks near Cu 2p, indicating that the CuBr obtained is of high purity and good crystallinity. FIGS. 4A-4C show the optical properties of the ultrathin 2D monocrystalline CuBr nanosheets prepared by Example 1 of the disclosure. FIG. 4B shows the room-temperature exciton absorption phenomenon of the ultrathin 2D monocrystalline CuBr nanosheets with two main absorption peaks of $Z_{1,2}$ and $Z_3$ excitons, which exhibiting a large exciton binding energy. FIG. 4B shows the room-temperature exciton fluorescence phenomenon of room-temperature exciton fluorescence phenomenon CuBr nanosheets near 416 nm, illustrating the prospect of CuBr for short-wave luminescent devices. FIG. 4C shows the fluorescence lifetime curve of the ultrathin 2D monocrystalline CuBr nanosheets, it can be seen from the figure that the material has a short fluorescence lifetime of 346.59 ps, indicating the high crystal quality of CuBr. FIG. 5 shows the performance of the photoelectric device for the ultrathin 2D monocrystalline CuBr nanosheets under different power illumination of 345 nm, showing the performance of the device with a non-zero current at 0 V, indicating its self-driven ultraviolet detection performance. FIG. 6 shows the ultrathin 2D monocrystalline CuBr nanosheets grown in Example 2, with a size of 45 μm and a thickness of 0.91 nm.

Figure 10A:
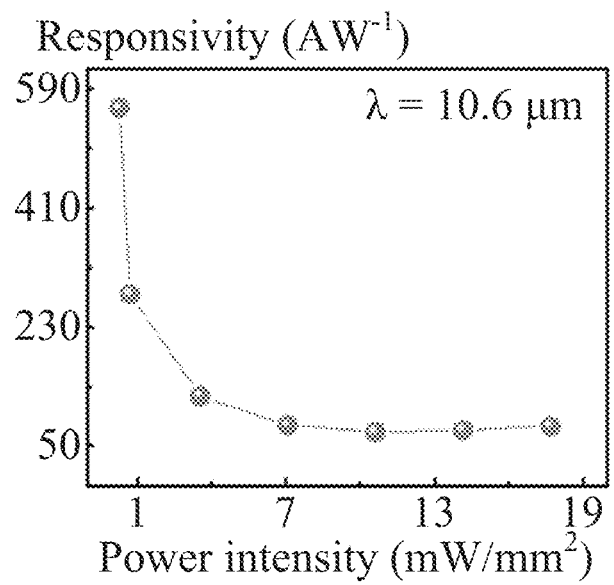
FIGS. 10A-10B are photoelectric performance test diagrams of the photodetector comprising the ultrathin 2D monocrystalline $Fe_3O_4$ nanosheets according to Example 5 of the disclosure.
Figure 10B:
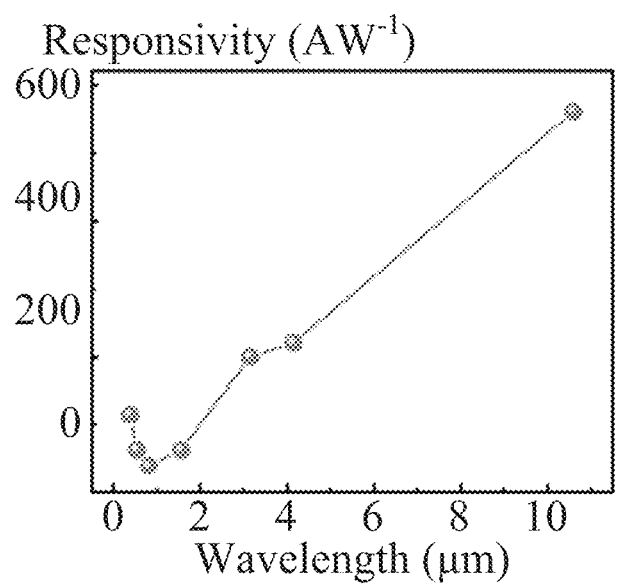

FIG. 7 shows the optical micrograph of the ultrathin 2D monocrystalline $Fe_3O_4$ nanosheet prepared by Example 5. It can be seen that ultrathin 2D monocrystalline $Fe_3O_4$ nanosheets is triangular in size from 2 to 6 nm. FIG. 8 is the TEM image of ultrathin 2D monocrystalline $Fe_3O_4$ nanosheets prepared by Example 5 of the disclosure. Image a is the low-resolution image of $Fe_3O_4$ nanosheet; Image b is the high-resolution image of $Fe_3O_4$ nanosheet with the lattice spacing of 0.307 nm; Images c and d are EDS-mapping, showing the element distribution of iron and oxygen, respectively, indicating that the substance is $Fe_3O_4$. FIG. 9 is the Raman spectrogram of ultrathin 2D monocrystalline $Fe_3O_4$ nanosheets prepared by Example 5 of the disclosure, in which the triangular nanosheets with thickness of about 40, 30, 20 and 8 nm were characterized. The characteristic peaks of nanosheets were located at 664.7, 535.6, 300.3 and 192.6 $cm^{-1}$, proving that the substance is $Fe_3O_4$. The tested substrate was $Al_2O_3$. FIG. 10 shows the photoelectric performance of the photodetector prepared from the ultrathin 2D monocrystalline $Fe_3O_4$ nanosheets of a thickness of 20 nm, according to Example 5 of the disclosure; FIG. 10A shows the photoresponsivity in the long-wavelength infrared (10.6 μm) at different power intensities; FIG. 10B shows the photoresponsivity at wavelength of 375 nm, 532 nm, 808 nm, 1550 nm, 3149 nm, 4144 nm and 10.6 μm, indicating that the detector has photoresponse in the ultra-wide spectral range. FIG. 11 shows the ultrathin 2D monocrystalline $Fe_3O_4$ nanosheet with a thickness of only 1.95 nm, which obtained in accordance with Example 6 of the disclosure.

FIG. 12 shows the dark field optical micrograph of the ultrathin 2D monocrystalline BiOBr nanosheets prepared by Example 8 of the disclosure, from which it can be seen that the BiOBr in Example 8 grows on the mica substrate and distributes with a circular morphology. FIG. 13 is the atomic force micrograph of the ultrathin 2D monocrystalline 2D BiOBr nanosheets prepared by Example 8. It can be seen from the figure that the thinnest ultrathin 2D monocrystalline BiOBr nanosheet can reach 0.57 nm. FIG. 14 is the TEM spectrum of ultrathin 2D monocrystalline BiOBr nanosheets prepared by Example 9 of the disclosure. FIG. 14A is the low-resolution image of the ultrathin 2D monocrystalline BiOBr nanosheets, and FIG. 14B is the high-resolution image. The lattice spacing of the nanosheet is 0.28 nm, and the corresponding crystal surface is (110). FIG. 15 is the XRD diagram of the BiOBr monocrystalline nanosheets prepared by Example 9 of the disclosure. The characteristic peaks (001), (002), (003) and (004) of 2D BiOBr with directional growth are attributed to the crystal plane (001), proving that the 2D BiOBr with directional growth is a layered material. FIG. 16 displays the SEM diagram of the ultrathin 2D monocrystalline BiOBr nanosheets triangular in shape prepared in Example 9 of the disclosure. FIG. 17 shows the SEM diagram of the ultrathin 2D monocrystalline BiOBr nanosheet prepared in Example 10 of the disclosure. It can be seen that the morphology of the nanosheets is an isosceles right triangle. FIG. 18 shows the photoelectric test of a BiOBr-based photodetector prepared by Example 10 of the disclosure; the I-V curves at wavelength of 245 nm, 295 nm, 315 nm, 345 nm, 375 nm, 405 nm show that the detector have photoresponse in the ultraviolet spectral range, and almost no response to the visible light. The highest detection performance can be obtained under at the wavelength of 245 nm with photoresponsivity of 2021.9 A/W, external quantum efficiency of $1.03 \times 106\%$ and detectivity of $2.95 \times 1013$ Jones. FIG. 19 shows the photoelectric response rate of the photodetector obtained from Example 10 of the disclosure. The rise and decay response times are 110 and 160 μs, respectively, indicating the fast photoresponse of the device.

It will be obvious to those skilled in the art that changes and modifications may be made, and therefore, the aim in the appended claims is to cover all such changes and modifications.

What is claimed is:

1. A method, comprising:
placing $BiX_3$ powder where X=I, Br, or Cl in a crucible, and putting the crucible on a first heating zone of a furnace disposed at a gas inlet of a quartz tube; placing substrates covered with metal sheets on a second heating zone of the furnace disposed at a gas outlet of the quartz tube;
vacuumizing the quartz tube by a mechanical pump; pumping Ar gas into the quartz tube until a gas pressure is equal to 101.325 kPa; pumping a carrier gas into the quartz tube and adjusting and maintaining a steady flow rate of the carrier gas; and
heating and maintaining the second heating zone; heating the first heating zone to evaporate $BiX_3$ until the ultrathin 2D nanosheets are formed on the substrate; and cooling the substrate naturally to 15-30° C.

2. The method of claim 1, wherein the metal sheets are unoxidized transition or naturally oxidized transition; the metal sheets and the substrates construct micro-nano scale confined space, and a gap distance between the metal sheets and the substrates is 0-100 microns.

3. The method of claim 2, wherein the transition metal sheets are copper sheets or iron sheets.

4. The method of claim 1, wherein the naturally oxidized transition metal sheets are oxidized in the air at 15-30° C. for 1-2 days.

5. The method, comprising:
1) placing $BiBr_3$ powder in a crucible, and putting the crucible on a first heating zone of a furnace disposed at a gas inlet of a quartz tube; placing substrates covered with copper sheets on a second heating zone of the furnace disposed at a gas outlet of the quartz tube; wherein a confined spacing gap between the copper sheets and the substrates is 0-100 μm;
2) vacuumizing the quartz tube to less than 0.1 Pa; pumping Ar gas into the quartz tube until an air pressure is equal to one atmosphere pressure; pumping mixed gas of Ar and $H_2$ to the quartz tube and adjusting and maintaining a steady flow rate of the mixed gas; and 3) heating the second heating zone to a temperature of 275-325° C. and keeping the temperature for 10-60 min; heating the first heating zone to 200-275° C. for 3-20 min until producing chemical reaction between $BiBr_3$ and metal sheets, and preparing ultrathin 2D nanosheets on the substrates simultaneously; and cooling the substrate naturally to 15-30° C., thereby yielding a two-dimensional ultrathin monocrystalline CuBr nanosheet.

6. The method of claim 5, wherein the substrates in 1) are mica or graphene substrate and a mass of the $BiBr_3$ powder is 2-200 mg.

7. The method of claim 5, wherein the $H_2$ in 2) is 0-10% (v/v) in the mixed gas and a flow velocity of the mixed gas is about 50-100 sccm.

8. A two-dimensional ultrathin monocrystalline CuBr nanosheet prepared according to the method of claim 5, wherein a thickness of the two-dimensional ultrathin monocrystalline CuBr nanosheet is 0.9-200 nm and a sheet size thereof is 2-150 μm.

9. A method for preparing a photodetector based on the two-dimensional ultrathin monocrystalline CuBr nanosheet of claim 8, the method comprising: depositing a silver electrode with a thickness of 25-100 nm using a copper mesh as a mask on the two-dimensional ultrathin monocrystalline CuBr nanosheet.

10. A method, comprising:
1) placing $BiI_3$ powder in a crucible, and putting the crucible on a first heating zone of a furnace disposed at a gas inlet of a quartz tube; placing substrates covered with naturally oxidized iron sheets on a second heating zone of the furnace disposed at a gas outlet of the quartz tube;
2) vacuumizing the quartz tube to less than 1 Pa; pumping Ar gas into the quartz tube until an air pressure is equal to one atmosphere pressure; continuously pumping the Ar gas to the quartz tube with a flow velocity of 10-75 sccm; and
3) heating the second heating zone to a temperature of 370-450° C. and keeping the temperature for 10-60 min; heating the first heating zone to 450-520° C. for 5-20 min until producing chemical reaction between $BiI_3$ and metal sheets, and preparing ultrathin 2D nanosheets on the substrates simultaneously; and cooling the substrate naturally to 15-30° C., thereby yielding a two-dimensional ultrathin monocrystalline $Fe_3O_4$ nanosheet.

11. The method of claim 10, wherein a mass of the $BiI_3$ powder in 1) is 1-20 mg and the substrates are mica.

12. The method of claim 10, wherein the naturally oxidized iron sheets in 1) is obtained by placing iron sheets in the air with 15-30° C. for 1 to 2 days.

13. A two-dimensional ultrathin monocrystalline $Fe_3O_4$ nanosheet prepared according to the method of claim 10, wherein a thickness of the two-dimensional ultrathin monocrystalline $Fe_3O_4$ nanosheet is 1.95-100 nm and a sheet size thereof is 1-20 nm.

14. A method for preparing the two-dimensional ultrathin monocrystalline $Fe_3O_4$ nanosheet of claim 13, the method comprising: transferring the $Fe_3O_4$ nanosheet from a mica substrate to an $Si/SiO_2$ substrate; depositing an electrode by electron beam exposure and thermal evaporation, the electrode comprising a Cr with a thickness of 1-10 nm and an Au with a thickness of 10-100 nm.

15. A method, comprising:
1) placing $BiBr_3$ powder in a crucible, and putting the crucible on a first heating zone of a furnace disposed at a gas inlet of a quartz tube; placing substrates covered with naturally oxidized copper sheets on a second heating zone of the furnace disposed at a gas outlet of the quartz tube;
2) vacuumizing the quartz tube to less than 0.1 Pa; pumping Ar gas into the quartz tube until an air pressure is equal to one atmosphere pressure; continuously pumping the Ar gas to the quartz tube with a flow velocity of 25-50 sccm; and
3) heating the second heating zone to a temperature of 380-400° C. and keeping the temperature for 1-60 min; heating the first heating zone to 220-275° C. for 5-30 min until producing chemical reaction between $BiI_3$ and metal sheets, and preparing ultrathin 2D nanosheets on the substrates simultaneously; and cooling the substrate naturally to 15-30° C., thereby yielding a two-dimensional ultrathin monocrystalline BiOBr nanosheet.

16. The method of claim 15, wherein a mass of the $BiBr_3$ powder in 1) is 2-50 mg.

17. The method of claim 15, wherein the naturally oxidized copper sheets in 1) is obtained by placing the copper sheets in the air with 15-30° C. for 1 to 2 days.

18. The method of claim 15, wherein the cooling in 3) is natural cooling or rapid cooling, and a rate of the rapid cooling is over 50° C./min.

19. A two-dimensional ultrathin monocrystalline BiOBr nanosheet prepared according to the method of claim 15, wherein a growth crystal surface of the two-dimensional ultrathin monocrystalline BiOBr nanosheet is (001), a thickness is 0.57-200 nm, and a sheet size is 0.5-70 nm.

20. A method for preparing a photodetector based on the two-dimensional ultrathin monocrystalline BiOBr nanosheet of claim 19, the method comprising: transferring the BiOBr nanosheet with a thickness of 0.57 nm-20 nm onto a silicon substrate using a wet method, and manufacturing an electrode by electron beam lithography and thermal evaporation.

* * * * *